United States Patent
Sun (10) Patent No.: US 6,381,139 B1
(45) Date of Patent: Apr. 30, 2002

(54) CARRIER FOR COMPUTER PERIPHERAL DEVICE

(75) Inventor: Benjamin Kao-Shing Sun, Mountain View, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/475,469

(22) Filed: Dec. 30, 1999

(51) Int. Cl.[7] .................................................. G06F 1/00
(52) U.S. Cl. ........................ 361/725; 361/685; 439/384; 360/98.01
(58) Field of Search ................................. 361/685, 727, 361/726, 725; 439/377, 384–385; 360/98.08, 98.01

(56) References Cited

U.S. PATENT DOCUMENTS

| | | | | |
|---|---|---|---|---|
| 4,941,841 A | * | 7/1990 | Darden et al. | 439/377 |
| 5,277,615 A | * | 1/1994 | Hastings et al. | 439/377 |
| 5,673,172 A | * | 9/1997 | Hasting et al. | 361/685 |
| 5,886,869 A | * | 3/1999 | Fussell et al. | 361/685 |
| 6,058,016 A | * | 5/2000 | Anderson et al. | 361/727 |
| 6,067,225 A | * | 5/2000 | Reznikov et al. | 361/685 |

* cited by examiner

Primary Examiner—Leo P. Picard
Assistant Examiner—Hung Van Duong
(74) Attorney, Agent, or Firm—Schwegman, Lundberg, Woessner & Kluth, P.A.

(57) ABSTRACT

A peripheral wrapper having a wrapper frame for enclosing the computer peripheral. The frame includes a first end for containing a connecting end of the computer peripheral. The wrapper includes a clip or gripping member attached to the frame near the second end of the frame, wherein the clip for grippedly and removably couples the frame to a dock section of a computer peripheral container chassis. The clip has a first leg coupled to the frame and a second leg generally parallel to first leg, the second leg not coupled to the frame. The second leg having a spring force towards the first leg when the clip is engaged to an edge of the chassis dock so that the clip is grippedly and removably attached to the chassis dock. In one embodiment, the clip includes a damping material located between the frame and the chassis dock. Another aspect of the present invention provides a computer peripheral modular system including a chassis having at least one dock. The chassis having a reinforced bottom dock panel and a top dock panel. The system including a computer peripheral wrapper adapted to fit within the dock. The computer peripheral wrapper having a clip for removably coupling the computer peripheral wrapper to an edge of the reinforced bottom deck panel.

47 Claims, 6 Drawing Sheets

CARRIER FOR COMPUTER PERIPHERAL DEVICE

FIELD OF THE INVENTION

This invention relates to the field of computer systems, and more specifically to wrappers for computer peripherals.

BACKGROUND OF THE INVENTION

In many applications, users have the need to store and process vast amounts of data. Such high-performance storage systems can be used in a variety of applications, such as video, data-warehousing, and seismic analysis, and in applications such as database, financial, and technology development. To work efficiently the data storage system needs scalability and reliability.

Modular storage systems help meet these goals. In a modular storage system, many computer peripheral devices, such as disk drives, are placed together within a box or chassis. Each of the disk drives or other computer peripheral devices are mounted within an apparatus called a wrapper, drivesled, or drive carrier. These wrappers enclose each device, and provide mechanical support, vibration/shock damping, and provide easy handling to permit the device to be quickly plugged into a slot or dock in the chassis. A chassis can hold a great number of wrapped devices. Moreover, the individual device modules can be easily replaced if one is damaged.

Although modular storage systems offer a big enhancement in performance, it is important to note that using more hardware also increases the likelihood of a failure. Moreover, given that data is spread across multiple disks, a drive failure could be catastrophic. One potential source of disk drive failure is caused by mechanical rotational vibration propagating through the system. Generally, a disk drive actuator arm is driven by a voice coil motor (VCM). The current sent through the VCM induces a torque on the actuator. This causes a reaction torque in the drive itself which leads to a rotational vibration reaction in the disk drive. This vibration then propagates through the chassis to other modular drives in the system, adversely affecting them. In addition, self-excitation may be induced, adversely affecting the drive in question.

In the past, one method to minimize the effects of a hard drives's vibrations is to attach a spring to the wrapper enclosing the drive. The spring is located so that when the wrapper is inserted within a chassis, the spring presses against one wall of the chassis and forces the wrapper against the opposing wall of the chassis. This system thus forcibly holds the wrapper assembly in place, essentially squeezing the wrapper into the dock of the chassis.

Such an approach has some deficiencies. One problem is that it offers two vibration transmission paths since the wrapper is in pressured contact with both walls that are adjacent to it. Thus, any vibrations from a drive are propagated through both adjacent walls and thus to neighboring drives which are also engaged with that wall. This means that the neighboring hard drives in the adjacent slots are affected by the vibrations of the drive. Also, such a system requires that both sides of the dock be reinforced or designed stiffer since there is pressure exerted on both sides. Another problem is that such a spring design leads to unwanted bowing or deflection of the chassis. The bowing of the chassis leads to a spring force which varies along the length of the chassis so that a wrapper in the center of the dock would more than likely have a lower spring force than a wrapper located at one of the end points of the dock.

Thus, for these reasons and others that will become apparent to those skilled in the art upon reading the present specification, there is a need for a drive wrapper that is not as vulnerable to these vibration problems while retaining the advantages of easy, modular installation of computer peripherals.

SUMMARY

The present invention provides a computer peripheral carrier which prevents and minimizes the effects of rotational vibrations of peripherals. In one embodiment, a computer peripheral carrier includes a frame for enclosing the computer peripheral. The carrier also includes a clip or gripping member attached to the frame near one end of the frame. The clip is for gripping a dock section of the container chassis and permitting the carrier to be removably coupled to the dock section. In further embodiments, the clip has a first leg coupled to the frame and a second leg generally parallel to first leg, the second leg not coupled to the frame. When the clip is engaged to an edge of a chassis dock, the second leg is forced away from the first leg so that a gripping force occurs between the two legs. Thus the clip forcibly grips the edge of the dock while also being removably attached to the dock.

Another aspect of the present invention provides a computer peripheral modular system including a chassis having at least one dock. The chassis has a reinforced bottom dock panel and a top dock panel. The system includes a computer peripheral carrier adapted to fit within the dock. The computer peripheral carrier having a clip for removably coupling the computer peripheral carrier to an edge of the reinforced bottom deck panel.

Advantageously, the present invention provides a modular and easily installable drive carrier which alleviates problems caused by rotational vibration of computer peripheral devices. It permits a designer to construct a stronger, stiffer side to a dock, thus helping to prevent rotational vibrations. It also provides that any vibrations which do arise are only propagated along one side of the dock, thus reducing the number of variables in which a designer needs to focus on in dealing with rotational vibration problems.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit of reference numbers appearing in the Figures generally corresponds to the Figure number in which that component is first introduced, such that the same reference number is used throughout to refer to an identical component which appears in multiple Figures.

FIGS. 1–4 show one embodiment of a peripheral wrapper 100 and a chassis 110 comprising a modular system according to the present invention. Peripheral wrapper 100 is used for enclosing and containing a computer peripheral device, including storage devices such as a hard drives and tape drives. Wrapper 100 includes a wrapper frame 101 and a gripping member such as a clip 102. As is known in the art, wrapper 100 is generally made from a metal material and can have a variety of dimensions depending on the dimensions of the computer peripheral to be contained within its body. The following description will generally refer to a hard drive as the peripheral used within wrapper 100. However, those skilled in the art will recognize that other peripherals can be used with the present system.

Such peripherals can be subject to rotational vibration. For instance, as is known in the art, hard drives include an actuator arm assembly driven by a voice coil motor (VCM). The actuator rotates about a pivot point within the hard drive during data seeks. These actuator rotations and VCM torques are often the source of the vibration. The effects of these vibrations are transmitted to the body of the hard drive and result in rotational vibration of the hard drive.

Figure 1:
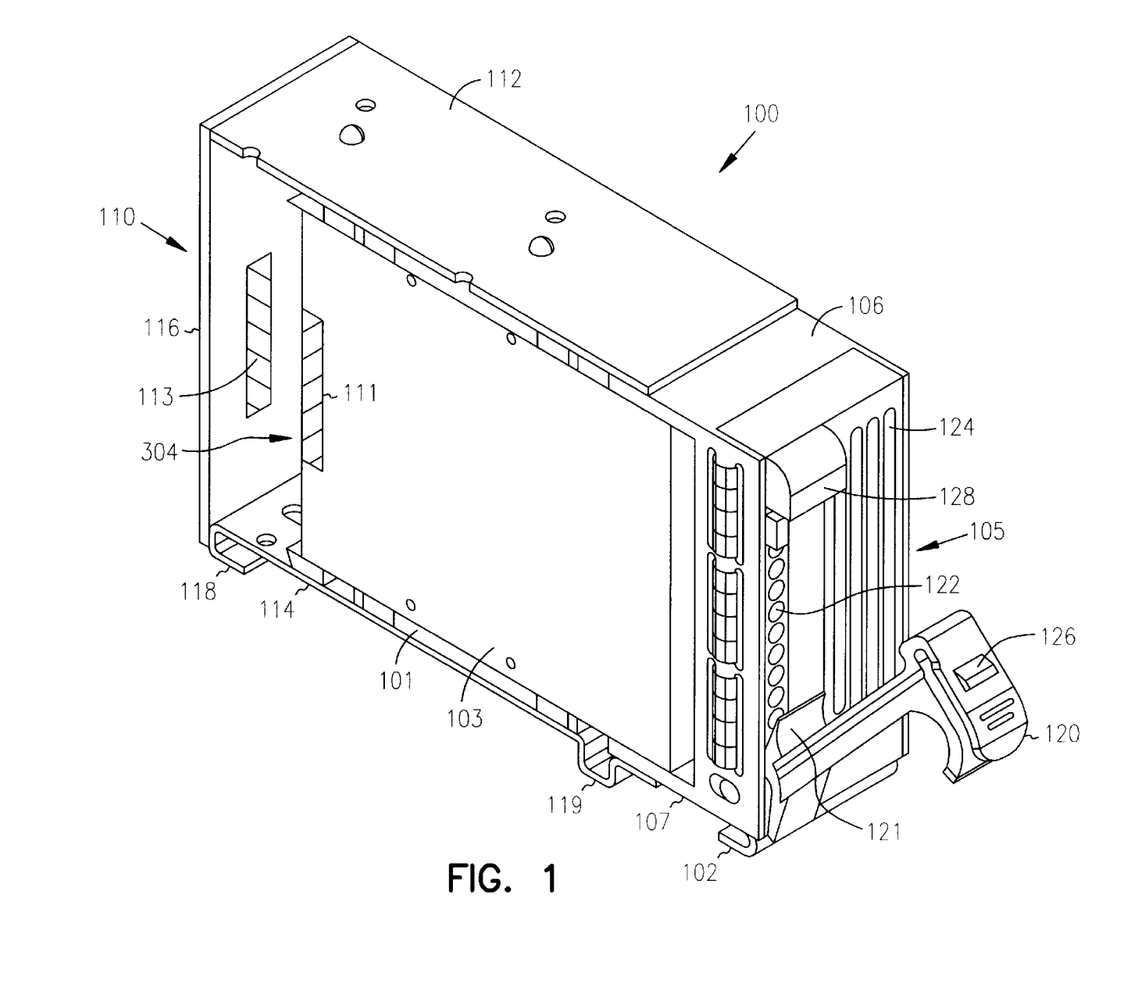
FIG. 1 shows one embodiment a peripheral wrapper and chassis dock system according to the present invention.
Figure 4:
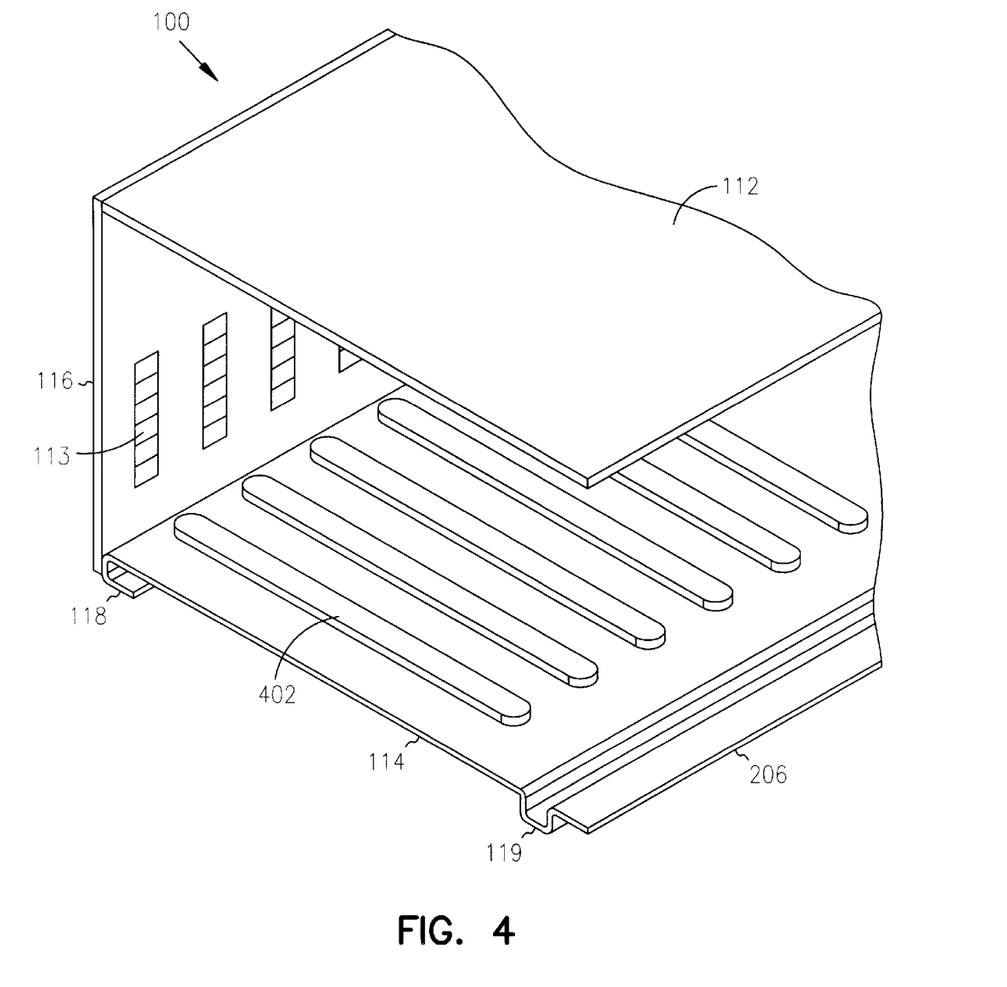
FIG. 4 shows additional details of the chassis dock of FIG. 1.

FIG. 1 shows wrapper 100 being inserted within a dock of chassis 110. Details of chassis 110 are shown in FIGS. 1 and 4. In FIG. 4, chassis 110 is shown partially cut-away. Chassis 110 is a box shaped container designed to contain and provide connection(s) 113 for a plurality of modular computer peripherals, such as hard drives 103 and other storage devices contained within wrappers, such as wrapper 100. In one embodiment, chassis 110 is an industry standard size, 19 inches wide and 5.75 (3u) inches high. Chassis 110 includes one or more docks or slots for the computer peripheral wrappers. Each dock includes a bottom guide, such as guide 402 and a top opposing guide (not shown). As will be explained below, these guides provide guidance for grooves 302 located on wrapper 100, ensuring that the wrapper is inserted correctly into the chassis.

Chassis 110 also includes a backpanel 116. Backpanel 116 provides a plurality of connectors 113 for connecting with a connector 111 on a computer peripheral. Each connector 113 is located at the rear portion of each dock section. Chassis 110 also includes a top dock panel 112 and a bottom dock panel 114. The dock panels 112 and 114 are generally constructed from a sheet metal material. In one embodiment, bottom panel 114 includes reinforcement features 118 and 119. These reinforcement features add stiffness to panel 114.

Referring again to FIG. 1, in one embodiment wrapper 100 encloses a computer peripheral such as a hard drive 103. Hard drive 103 is enclosed within an inner cavity of frame 101. The inner cavity is defined in part by a pair of parallel and opposing walls 106 and 107. Walls 106 and 107 are connected at one end by a back wall 304 (see FIG. 3). Walls 106 and 107 are also connected near another end by a front wall 105. It is to be understood that the terms back and front are to be taken in their relative sense concerning the present description of wrapper 100, and they are not to be taken in an absolute, limiting sense. Walls 304 and 105 are perpendicularly located relative to both walls 106 and 107. In one embodiment, wall 304 can include one or more cut-outs 306 and 308 within its surface to permit connector(s) 111 on hard drive 103 to mate with opposing outside connectors.

Figure 3:
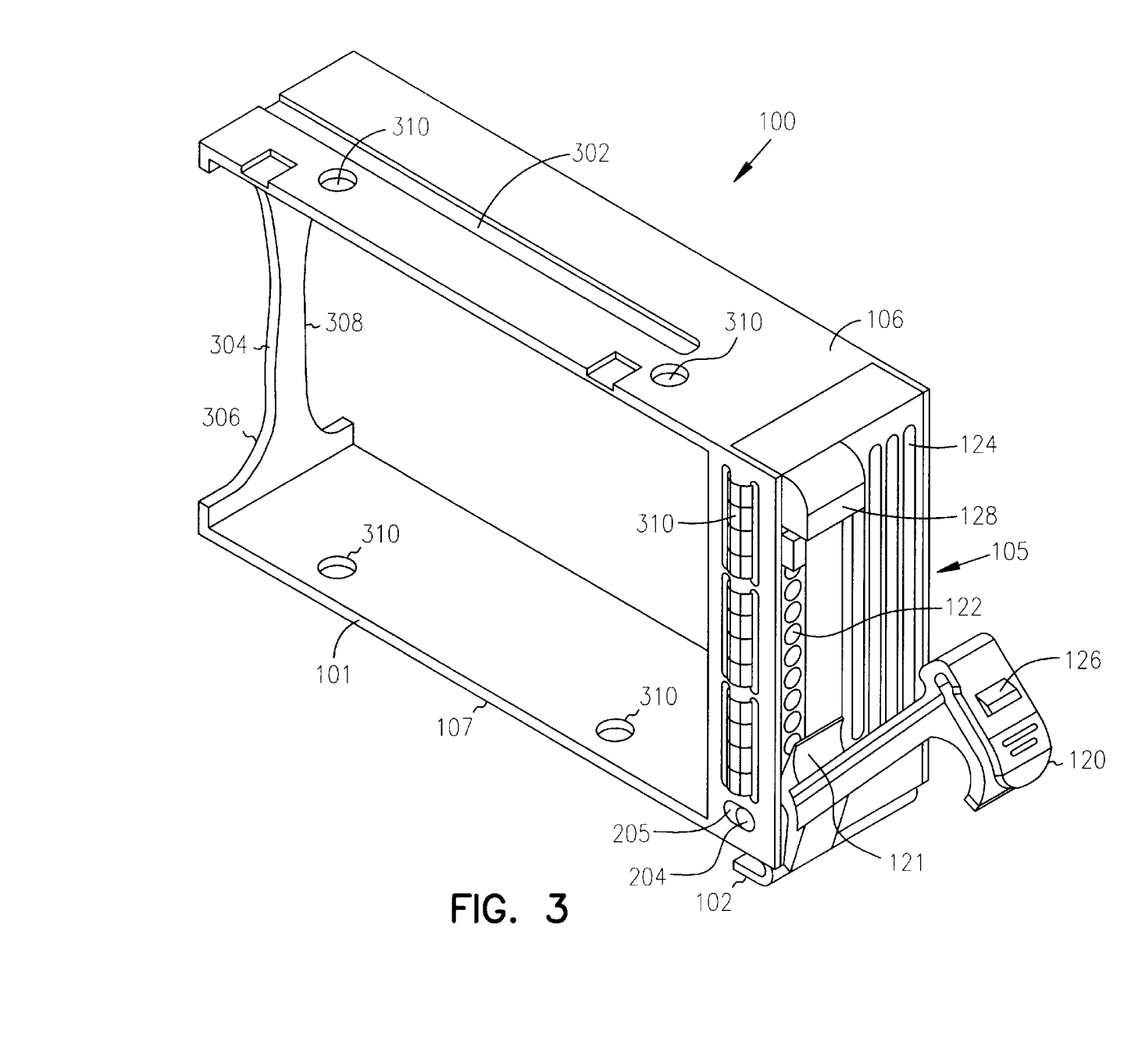
FIG. 3 shows additional details of the peripheral wrapper of FIG. 1.

In one embodiment, walls 106 and 107 can include attachment holes, such as holes 310. These holes permit a screw to be inserted therein to attach a computer peripheral such as hard drive 103 within the wrapper. Walls 106 and 107 can also include grooves 302 for guidance when installing a wrapper within a chassis. The grooves align with guidance members 402 of chassis 110 to permit a user to easily install a wrapper in the correct position. Those skilled in the art will also recognize that wrapper 100 can include EMI tabs 310, air flow vents 122 (which also act as an EMI barrier), and other features, and that these and the noted features can be varied within the scope of the present invention depending on the particular design criteria.

Figure 2:
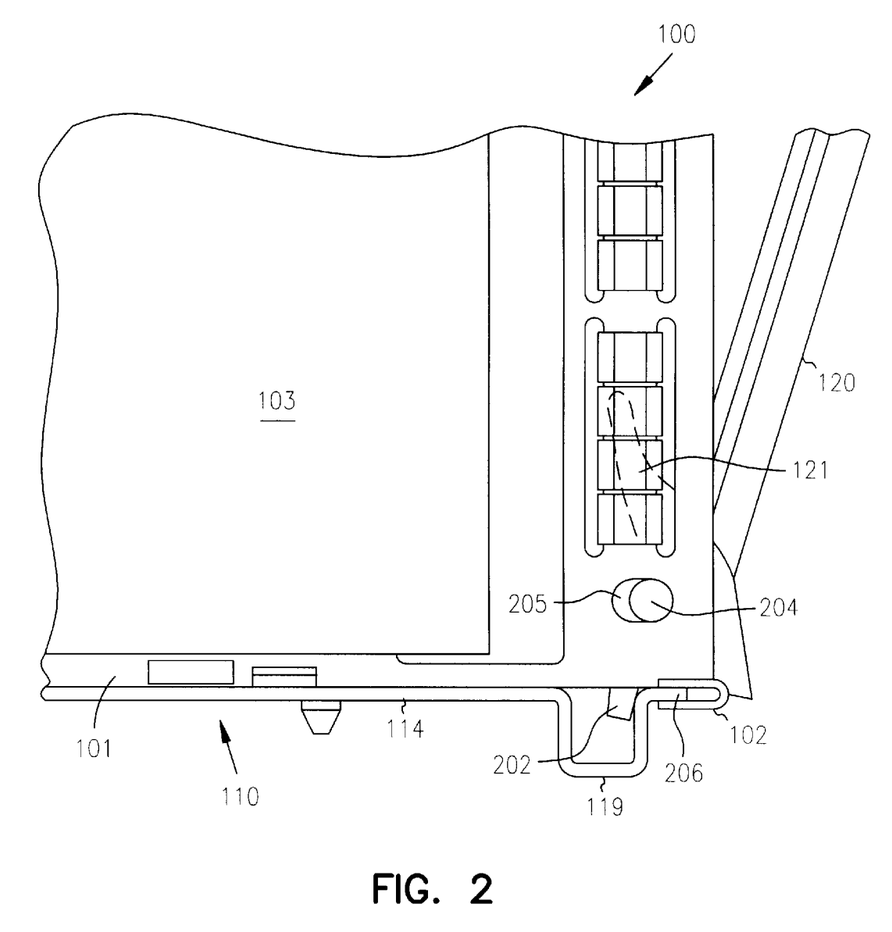
FIG. 2 shows details of the wrapper and dock of FIG. 1.

Wrapper 100 also includes gripping member or spring clip 102. As is shown in FIG. 2, clip 102 grippedly attaches to edge 206 of a dock panel 114. Clip 102 is a generally U-shaped member. In one embodiment, it is located along wrapper wall 107 proximate front wall 105. Alternatively, it could be located on the opposing wall 106 proximate to front wall 105. In one embodiment, clip 102 can be an integrally attached portion of wrapper 100, manufactured as a unit from the same material as wrapper frame 101. Alternatively, clip 102 can be separately manufactured and mechanically attached to frame 101 using screws, bolts, adhesives, welding, or any equivalent means.

Figure 5:
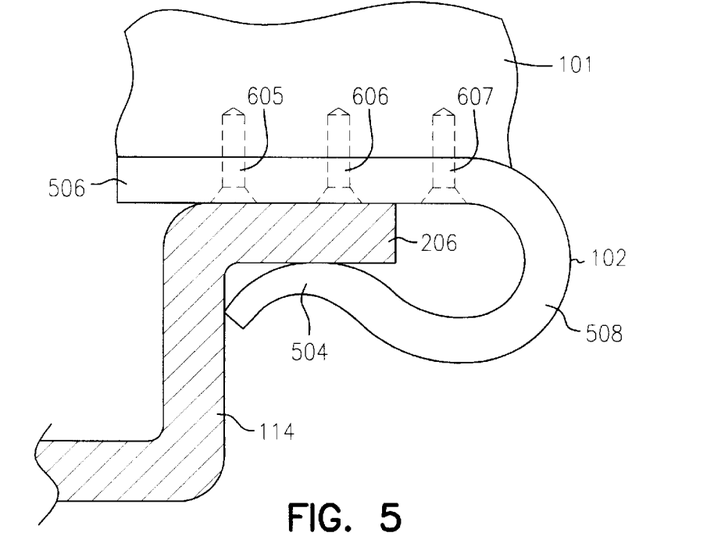
FIG. 5 shows one embodiment of a wrapper clip according to the present invention.
Figure 6:
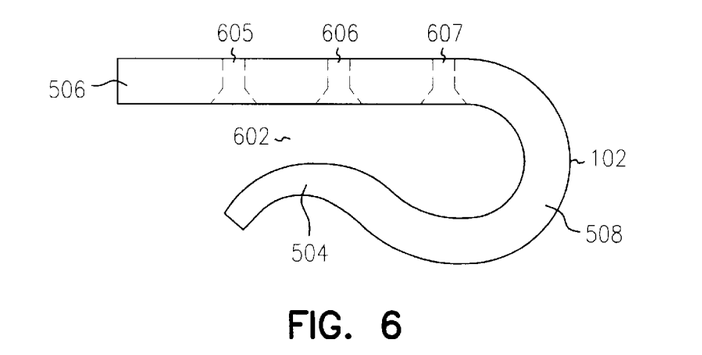
FIG. 6 shows details of the wrapper clip of FIG. 5.

FIGS. 5 and 6 shows details of one embodiment of wrapper clip 102. Clip 102 includes a first leg 506 rigidly attached, either mechanically or integrally, to wrapper frame 101. Clip 102 also includes a second leg 504. Second leg 504 is generally parallel and opposing first leg 506. Legs 504 and 506 are connected by end section 508. In one embodiment, clip 102 includes attaching holes 605–607 for placing an attaching means such as a screw therethrough for attaching clip 102 to frame 101. Attaching holes 605–607 can include countersunk holes or other type holes permitting an attaching means to rigidly attach clip 102 to frame 101. Alternatively, as noted above, clip 102 can be an integral feature of wrapper 100 and thus be integrally attached to frame 101.

Clip 102 also includes an open end 602 defined by the open gap between legs 504 and 506. Open end 602 is for sliding clip 102 onto an edge 206 of panel 114 of chassis 110. When clip 102 is pushed onto edge 206, second leg 504 is forced to an open position. Clip 102 has a spring force characteristic such that legs 504 and 506 have a gripping force therebetween when they are opened beyond a nominal distance. Thus, when legs 504 and 506 are pushed apart, they apply a squeezing spring force therebetween. This gripping force provides a tight gripping attachment to a surface such as edge 206. Clip 102 is designed to provide a gripping, yet removable, attachment of wrapper 100 to a dock within a computer peripheral chassis container such as chassis 110. Such a spring force holds the wrapper rigidly to the chassis panel 114. Advantageously, such an attachment can prevent rotational vibration of the disk drive. Furthermore, as noted above, in one embodiment chassis panel 114 can be strongly reinforced. In that situation, vibrations can be even further prevented since panel 114 will be even more rigid. Also, since the clip is attached at the front end of chassis 110, and the peripheral is connected to connector 113 at the back end of the chassis, there is a similar stiffness at both ends of the peripheral, which also helps prevent rotational vibrations.

Figure 7:
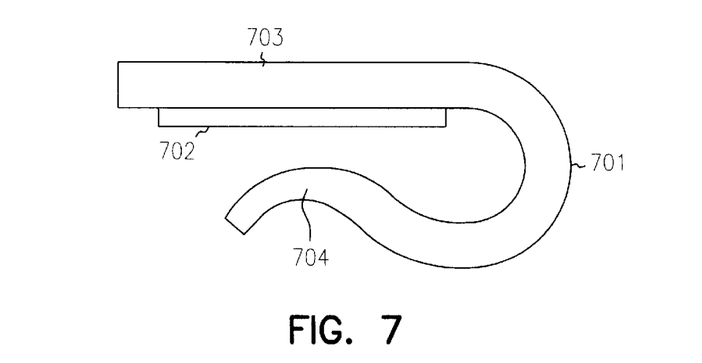
FIG. 7 shows another embodiment of a wrapper clip according to the present invention.

FIG. 7 shows another embodiment of a wrapper clip 701. Wrapper clip 701 is substantially equivalent to clip 102 described above. However, clip 701 also includes a damping material member such as constrained layer damping (CLD) section 702. In one embodiment, CLD section 702 is attached to an inner face of a first leg 703. Alternatively, CLD section 702 can be attached to the outer face of first leg 703, the inner face of a second leg 704, or around the whole interior of clip 701, as long as it is somewhere between the wrapper and the dock panel. The damping material is best placed in a high pressure area between the wrapper and the dock, such as the area where the clip attaches to the dock. In addition, the CLD section 702 may be placed onto the frame 101 itself. For example, it could be located on the face of the frame opposite the outer surface of leg 703. In one embodiment, CLD section 702 is a damping material whereby shear or normal strains of the material result in energy dissipation and therefore damping. CLD section provides further damping of rotational vibration transmitted by computer peripheral 103. When peripheral 103 vibrates, part of the vibration is damped by the material of CLD section 702. This damping, along with the gripping attachment provided by clip 701 greatly reduces rotational vibration transmissions by hard drive 103.

In one embodiment, wrapper 100 is not attached or engaged to top panel 112. Advantageously, since wrapper 100 is only coupled to one of the dock panels of chassis 110, the other panel, in this case panel 112, does not need to be reinforced since no rotational vibrations from the computer peripheral 103 are transmitted to it. As noted above, a designer may only have a standard space to work with, for example 5.75 inches (3u) of height for a chassis dock. Since, the computer peripheral takes up an unadjustable amount of space, a designer is left with a standard amount of space to work with. In such a case, the present system provides for a single reinforced panel that is stronger or stiffer than can be accomplished if both sides 106 and 107 are engaged with the chassis. In other words, if wrapper 100 is in direct contact with both panels (pressing up against them, for instance), then both panels would need to be reinforced with anywhere up to 0.5 inch reinforcements. However, since in the present system, wrapper 100 is only engaged with the bottom panel, bottom panel 114 can be reinforced by, for example, 1 inch reinforcements 118 and 119. Such relatively larger reinforcements provide for a much sturdier and stiffer structure and provide for greater prevention of rotational vibrations of hard drive 103. The single one inch reinforcements provide a higher prevention of vibration and damping of vibration than two 0.5 inch reinforcements. Moreover, referring to FIG. 4, when all of the docks of chassis 110 are filled with peripherals, the only side that vibrations are transmitted and propagated through is panel 114 and not panel 112. Also, if additional damping needs to be added to the dock (for example, in the form of a CLD section), then only one and not two pieces of sheet metal needs the reinforcement.

In one embodiment, wrapper 100 can also include a handle 120 for inserting the wrapper into and pulling the wrapper out of a dock of chassis 110. Handle 120 is pivotally coupled to the wrapper within a bezel 124 located near the front wall 105 of wrapper 100. Handle 120 includes a pre-load section 121, which extends from the main body of the handle. When handle 120 is fully rotated to a closed position, holding member 126 of the handle 120 latches into feature 128 of bezel 124 ro an equivalent feature incorporated into wrapper frame 101. During this process, latching member 202 of handle 120 contacts the retention groove provided by reinforcement 119, and thus the rotation of handle 120 is transformed into a linear translation of wrapper 100. Also, concurrently with the above process, pre-load section 121 deflects and acts like a leaf spring to maintain pressure at the connection between peripheral connector 111 and connector 113 on the chassis while also taking up tolerances in the insertion direction. Wrapper 100 also includes a slot 205 for engaging with a pivot post 204 of the handle 120. The slot provides that the wrapper 100 can travel a variable distance in the insertion direction. In the case of perfect assemblage (when all dimensions are at there nominal values), the post 204 will lie at the center of the slot. In the case of imperfect assemblage, the pivot post 204 will translate, or justify, itself within slot 205 accordingly.

When installing a peripheral such as hard drive 103, a user inserts the wrapper into a dock of chassis 110. Handle 120 is pivoted and, via the transformation described above, it cams the wrapper into the proper connected position. While being installed, the gripping spring clip 102 stretches slightly (leg 504 is deflected away from leg 506) to accept the edge 206 of the panel 114. The spring force of clip 102 provides a gripping force which holds the wrapper and, thus the drive, in place and helps to prevent rotational vibration of the disk. Moreover, the clip takes up tolerances between the dock and the wrapper.

To remove the wrapper, the handle is pivoted and as it rotates it slowly cams the wrapper out of its connected position and clip 102 is pulled off of the edge of the panel 114. In this way, the mechanical advantage of the lever arm is utilized during extraction as well as insertion. No special tools are needed to either engage or remove the clip from the chassis. Thus, the present system allows for a simple, quick, hot swap process of changing disk drives or other peripherals enclosed within wrapper 100.

Figure 8:
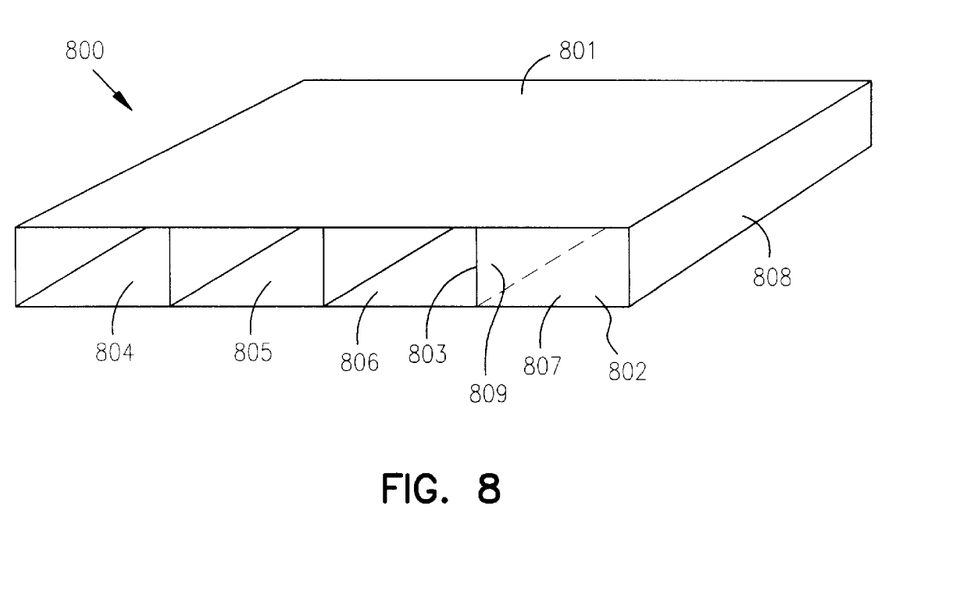
FIG. 8 shows another embodiment of a chassis dock system according to the present invention.

FIG. 8 shows one embodiment of a modular system 800. Modular system 800 is a horizontal dock system. It includes chassis 801 made from extruded aluminum. Chassis 801 includes a plurality of docks 804–807. These docks provide a space for a plurality of wrappers, such as a wrapper 802 to fit within. Wrapper 802 is substantially as described above concerning wrapper 100, and thus is only shown schematically. Wrapper 802 includes a clip 803 for attaching to a side wall 809. In a horizontal docking system, the walls are made from extruded aluminum and thus do not require features such as reinforcements 118 and 119 of dock panel 112 since the extrusion will have a much higher inherent stiffness than a sheet metal structure. Clip 803 provides that rotational vibrations of a hard drive mounted within wrapper 802 will be partially prevented by the holding force of wall 809 and that they will not be transmitted through the opposing wall 808. Thus, as more drives are added to slots 804–806, each drive will be grippedly coupled with one wall in its dock section, and not the other one. This provides that each drive's rotational vibration will not directly propagate through its connected wall to another drive in the system.

To install a peripheral such as a hard drive in system 800, a user mounts the drive within a wrapper 802, then installs the wrapper into the dock. The gripping clip stretches slightly to accept the edge of the wall 809. The spring force of the clip provides a gripping force which holds the drive in place and helps to prevent rotational vibration of the disk. To remove the wrapper, the user pulls the system out, usually by a handle attached to the wrapper assembly, as discussed above. The clip 803 is slowly pulled off of the edge of wall 809. No special tools are needed to either engage or remove the clip from the chassis. The extrusion itself can include the retention groove provided by feature 119 as described above. Thus, it provides for a simple and quick hot swap process of changing disk drives or other peripherals mounted within wrapper 802. Moreover, the present system provides that tolerances between the wrapper and the dock are accounted for, and the present system does not lead to undesirable bowing of the walls of the dock.

Advantageously, the present invention provides a modular and easily installable drive wrapper which alleviates problems caused by rotational vibration of computer peripheral devices. It permits a stronger, stiffer reinforced dock panel, thus helping to prevent rotational vibrations. It does not lead to unwanted bowing of the panel. It also provides that any vibrations which do arise are only propagated to one side of the dock, and thus the design removes one of the vibration transmission paths between neighboring disk drives.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A peripheral carrier for supporting a peripheral device within a chassis, the peripheral carrier comprising:
    a frame for enclosing the peripheral device, the frame having a first end and a second end, the first end for containing a connecting end of the peripheral device; and
    a clip attached to the frame, the clip located proximate the second end of the frame, the clip having an open end positioned to receive an edge of the chassis, wherein the clip grippedly holds the edge of the chassis when the frame is inserted into the chassis.

2. The peripheral carrier of claim 1, the clip open end facing the first end of the frame.

3. The peripheral carrier of claim 1, wherein the frame comprises a first pair of walls, the first pair of walls parallel to each other, the frame further comprising a back wall perpendicular to each of the first pair of walls, the back wall attached near an end of each of the first pair of walls, the frame further comprising a front wall perpendicular to each of the first pair of walls and parallel to the back wall, and wherein the clip attached to one of the first pair of walls proximate the front wall, and wherein the clip is couplable to only a single edge of the chassis.

4. The peripheral carrier of claim 1, wherein the clip is an integrally attached gripping member of the frame.

5. The peripheral carrier of claim 1, wherein the clip comprises a separate gripping member coupled to the frame.

6. The peripheral carrier of claim 1, further comprising a damping material member attached to the clip.

7. The peripheral carrier of claim 1, further comprising a damping material member attached to the frame.

8. The peripheral carrier of claim 1, wherein the clip is couplable with only a single edge of the chassis.

9. The peripheral carrier of claim 1, wherein the clip comprises a first leg attached to the frame and a second leg connected to the first leg and generally parallel to the first leg, the second leg not attached to the frame.

10. The peripheral carrier of claim 1, further comprising a handle pivotally coupled to the second end of the frame.

11. The peripheral carrier of claim 3, wherein the back wall comprises the first end of the frame and the front wall comprises the second end of the frame.

12. The peripheral carrier of claim 3, wherein each of the first pair of walls includes a grooved guide section.

13. The peripheral carrier of claim 9, wherein the second leg is forced away from the first leg when the clip is engaged to the edge of the chassis so that the first leg and the second leg have a gripping force therebetween.

14. The peripheral carrier of claim 10, wherein the handle includes a pre-load section for providing a pre-load force between the peripheral and the chassis.

15. The peripheral carrier of claim 10, wherein the handle includes a pivot post and wherein the frame includes a slot for engaging the pivot post, wherein the pivot post is translatable within the slot.

16. A peripheral carrier for inserting within a chassis, the carrier comprising:
    a frame for enclosing the peripheral; and
    a gripping member attached to the frame for removably coupling the frame to a panel of the chassis, wherein the gripping member grips an edge of the panel when the frame is inserted within the chassis.

17. The peripheral carrier of claim 16, wherein the frame including a first end and a second end, the first end for containing a connecting end of the computer peripheral, the gripping member located proximate the second end of the frame.

18. The peripheral carrier of claim 16, wherein the gripping member is only couplable to a single panel of the chassis.

19. The peripheral carrier of claim 16, wherein the gripping member includes a damping material section located between the frame and the chassis when the frame is coupled to the chassis.

20. The peripheral carrier of claim 16, wherein the gripping member comprises a spring clip.

21. The peripheral carrier of claim 16, wherein the gripping member comprises a first leg coupled to the frame and a second leg connected to the first leg and generally parallel to the first leg, the second leg not coupled to the frame.

22. The peripheral carrier of claim 16, further comprising a handle pivotally coupled to the frame for inserting and removing the frame from the chassis.

23. The peripheral carrier of claim 19, wherein the damping material section comprises a constrained layer damping section.

24. The peripheral carrier of claim 21, wherein the second leg applies a spring force towards the first leg when the gripping member is engaged to the edge of the chassis.

25. The peripheral carrier of claim 22, wherein the handle includes a pre-load section for providing a pre-load force between the peripheral and the chassis.

26. The peripheral carrier of claim 22, wherein the handle includes a pivot post and wherein the frame includes a slot for engaging the pivot post, wherein the pivot post is translatable within the slot.

27. A computer peripheral modular system, comprising;
    a chassis having at least one dock; and
    a peripheral carrier adapted to fit within the at least one dock, the peripheral carrier having a clip which grips an edge of the at least one dock for removably coupling the peripheral carrier to the edge of the at least one dock.

28. The computer peripheral modular system of claim 27, wherein the at least one dock having a reinforced bottom dock panel and a top dock panel, the peripheral carrier removably coupled to the reinforced bottom deck panel.

29. The computer peripheral modular system of claim 27 further comprising a handle pivotally coupled to the carrier for inserting and removing the carrier from the chassis.

30. The computer peripheral modular system of claim 27, wherein the chassis includes a plurality of horizontal docks, each dock defined by a pair of side walls; and wherein the peripheral carrier clip is for removably coupling the peripheral carrier to only one of the pair of side walls of the dock.

31. The computer peripheral modular system of claim 28, wherein the top dock panel comprising a non-reinforced panel, the carrier not attached to the top dock panel.

32. The computer peripheral modular system of claim 29, wherein the handle includes a pre-load section for providing a pre-load force between a peripheral within the peripheral carrier and the chassis.

33. The computer peripheral modular system of claim 29, wherein the handle includes a pivot post and wherein the peripheral carrier includes a slot for engaging the pivot post, wherein the pivot post is translatable within the slot.

34. A peripheral carrier for inserting a peripheral device into a chassis, the peripheral carrier comprising:
a frame for enclosing the peripheral device, the frame having a first end and a second end, the first end for containing a connecting end of the peripheral device;
a clip attached to the frame, the clip located proximate the second end of the frame, the clip having an open end for grippedly receiving an edge of the chassis therein; and
a damping material member attached to the clip.

35. A peripheral carrier for inserting a peripheral device into a chassis, the peripheral carrier comprising:
a frame for enclosing the peripheral device, the frame having a first end and a second end, the first end for containing a connecting end of the peripheral device;
a clip attached to the frame, the clip located proximate the second end of the frame, the clip having an open end for grippedly receiving an edge of the chassis therein; and
a damping material member attached to the frame.

36. A peripheral carrier for inserting a peripheral device into a chassis, the peripheral carrier comprising:
a frame for enclosing the peripheral device, the frame having a first end and a second end, the first end for containing a connecting end of the peripheral device;
a clip attached to the frame, the clip located proximate the second end of the frame, the clip having an open end for grippedly receiving an edge of the chassis therein; and
a handle pivotally coupled to the second end of the frame, wherein the handle includes a pivot post and wherein the frame includes a slot for engaging the pivot post, wherein the pivot post is translatable within the slot.

37. A peripheral carrier for inserting a peripheral device within a chassis, the peripheral carrier comprising:
a frame for enclosing the peripheral device; and
a gripping member attached to the frame for removably coupling the frame to a panel of the chassis, wherein the gripping member includes a damping material section located between the frame and the chassis when the frame is coupled to the chassis.

38. The peripheral carrier of claim 37, wherein the damping material section comprises a constrained layer damping section.

39. A peripheral carrier for inserting a peripheral device within a chassis, the peripheral carrier comprising:
a frame for enclosing the peripheral device; and
a gripping member attached to the frame for removably coupling the frame to a panel of the chassis, wherein the gripping member comprises a spring clip.

40. A peripheral carrier for inserting a peripheral device within a chassis, the peripheral carrier comprising:
a frame for enclosing the peripheral device; and
a gripping member attached to the frame for removably coupling the frame to a panel of the chassis, wherein the gripping member comprises a first leg coupled to the frame and a second leg connected to the first leg and generally parallel to the first leg, the second leg not coupled to the frame.

41. The peripheral carrier of claim 40, wherein the second leg applies a spring force towards the first leg when the gripping member is engaged to an edge of the chassis.

42. A peripheral carrier for inserting a peripheral device within a chassis, the peripheral carrier comprising:
a frame for enclosing the peripheral device;
a gripping member attached to the frame for removably coupling the frame to a panel of the chassis; and
a handle pivotally coupled to the frame for inserting and removing the frame from the chassis, wherein the handle includes a pivot post and wherein the frame includes a slot for engaging the pivot post, wherein the pivot post is translatable within the slot.

43. A computer peripheral modular system, comprising;
a chassis having at least one dock; and
a peripheral carrier adapted to fit within the at least one dock, the peripheral carrier having a clip for removably coupling the peripheral carrier to an edge of the at least one dock;
wherein the at least one dock has a reinforced bottom dock panel and a top dock panel, the peripheral carrier removably coupled to the reinforced bottom deck panel.

44. The computer peripheral modular system of claim 43, wherein the top dock panel comprises a non-reinforced panel, the peripheral carrier not attached to the top dock panel.

45. A computer peripheral modular system, comprising;
a chassis having at least one dock;
a peripheral carrier adapted to fit within the at least one dock, the peripheral carrier having a clip for removably coupling the peripheral carrier to an edge of the at least one dock; and
a handle pivotally coupled to the carrier for inserting and removing the carrier from the chassis.

46. The computer peripheral modular system of claim 45, wherein the handle includes a pre-load section for providing a pre-load force between a peripheral within the peripheral carrier and the chassis.

47. The computer peripheral modular system of claim 45, wherein the handle includes a pivot post and wherein the peripheral carrier includes a slot for engaging the pivot post, wherein the pivot post is translatable within the slot.

* * * * *